United States Patent [19]

Sonoda et al.

[11] Patent Number: 4,910,577
[45] Date of Patent: Mar. 20, 1990

[54] LEAD FRAME

[75] Inventors: Atsushi Sonoda, Oita; Toshiharu Sakurai, Yokohama; Akinori Nakatsuru; Tetsuo Ito, both of Oita, all of Japan

[73] Assignee: Kabushiki Kaisha Toshiba, Kawasaki, Japan

[21] Appl. No.: 229,456

[22] Filed: Aug. 8, 1988

[30] Foreign Application Priority Data

Aug. 10, 1987 [JP] Japan ................... 62-199630

[51] Int. Cl.$^4$ ............. H01L 23/28; H01L 23/48
[52] U.S. Cl. ........................ 357/70; 357/72; 357/74
[58] Field of Search ............ 357/70, 72, 74, 65, 357/68

[56] References Cited

FOREIGN PATENT DOCUMENTS

| 0016357 | 1/1984 | Japan | 357/72 |
| 0123046 | 7/1985 | Japan | 357/72 |
| 0115752 | 5/1987 | Japan | 357/74 |
| 0239967 | 10/1988 | Japan | 357/72 |

*Primary Examiner*—Rolf Hille
*Assistant Examiner*—Hoanganh Le
*Attorney, Agent, or Firm*—Foley & Lardner, Schwartz, Jeffery, Schwaab, Mack, Blumenthal & Evans

[57] ABSTRACT

In a lead frame having a number of square dimples arranged on the rear side of a bed portion in a lattice form of a pitch t, each side of the square dimples is disposed to form a predetermined angle relative to either of X—Y axes of the lattice extending in lateral and longitudinal directions of the bed portion. The square dimples may be provided at entire intersecting points between two sets of lines extending in parallel with the X and Y axes, or every other intersecting points of the same, so that an equal pitch of t or 2t is maintained between the dimples arranged in X and Y directions.

4 Claims, 4 Drawing Sheets

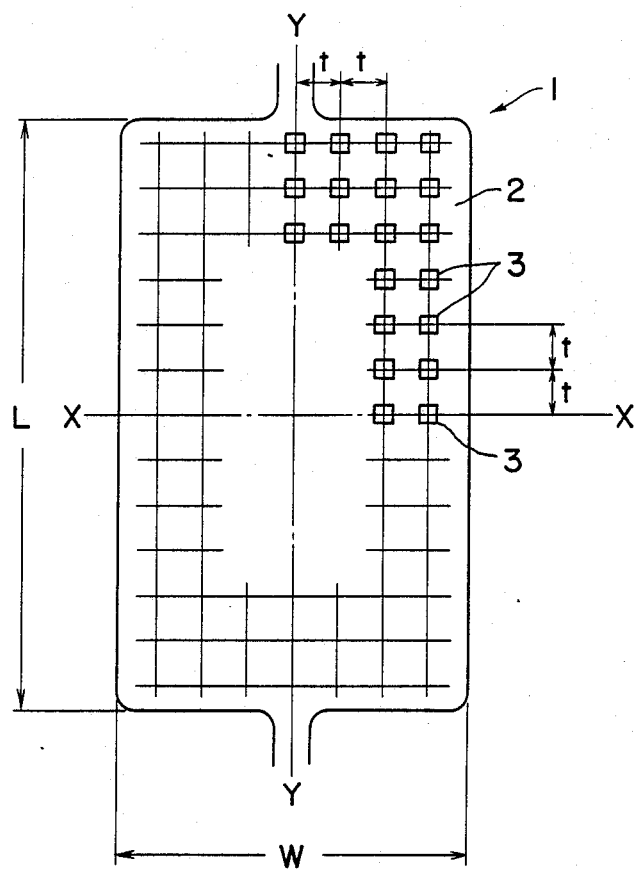
FIG. 5
PRIOR ART
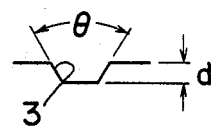   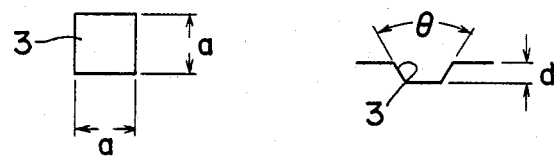
FIG. 6a
PRIOR ART
FIG. 6b
PRIOR ART

LEAD FRAME

BACKGROUND OF THE INVENTION

This invention relates to a lead frame having a bed portion for mounting an IC chip, and more particularly to a type in which a number of square-formed dimples are indented on the rear side of the bed portion.

Heretofore, a bed portion (or island portion) has been provided in a lead frame for mounting an IC chip, and the bed portion is thereafter molded together with the IC chip by use of a synthetic resin and the like. However, due to the difference in thermal expansion coefficient between the synthetic resin and the metal forming the lead frame, thermal stresses tend to concentrate in corners of the bed portion.

In order to disperse thermal stresses for avoiding resin cracks, a number of dimples have been formed on the rear side of the bed portion. The dimples are arranged in a lattice form at intersecting points between a number of imaginary parallel lines disposed in a transverse direction, herein designated X, and a number of imaginary parallel lines disposed in a longitudinal direction herein designated Y perpendicular to X of the bed portion with an equal spacing maintained therebetween. For instance, in a case of a bed portion having a length of 7.6 mm and a width of 4.4 mm. the pitches of the dimples in both directions are selected to be 0.5 mm, and each dimple has been formed into an inverted frustum of a pyramid having a square base of 0.15 ×0.15 mm, an opening angle of 60°, and a depth of 0.05 mm, each side of the dimple being disposed in parallel with the X-Y directions.

Although there is no restriction in the shape of the dimple itself, the aforementioned configuration has been selected because of easiness in production of a press-forming die.

However, in a case where the dimples are arranged such that each side of the dimple extends in parallel with X or Y axis of the base portion, the material removed at the time of forming dimples is shifted aside so as to form rising-up portions on the four sides of each dimple. The strained portions thus provided around the dimples interfere with each other and intensify the stresses in X-Y directions, and present bending deformation of the bed portion along the X-Y directions.

SUMMARY OF THE INVENTION

An object of the present invention is to provide a lead frame having a bed portion with a number of square shape dimples formed on the rear side of the bed portion, wherein the bending deformation occurring in the bed portion is substantially reduced.

Another object of the invention is to provide a lead frame having a bed portion with a number of square shaped dimples formed on the rear side of the bed portion, in which the square-formed dimples are arranged and disposed such that the strain occurring between these dimples is disposed in the diagonal directions of the bed portion.

These and other objects can be achieved by a lead frame having a number of square dimples arranged on the rear side of a bed portion in a lattice form, wherein each side of the square dimple is disposed obliquely so as to form a predetermined angle relative to either of X-Y axes of the lattice extending in widthwise and lengthwise directions of the bed portion.

Preferably the predetermined angle formed by each side of the square dimple is selected to be 45°.

Furthermore, the square dimples arranged in a lattice form of a pitch t may be provided at entire or every other intersecting points of lattice forming lines extending in parallel with the X and Y axes, so that an equal pitch of t or 2t is maintained between the dimples arranged along the and Y axes.

BRIEF DESCRIPTION OF THE DRAWINGS

In the accompanying drawings:

FIGS. 5 and 6(a) and 6(b) are diagrams similar to FIGS. 1 and 2(a) and 2(b) showing the conventional construction of the lead frame.

DESCRIPTION OF PREFERRED EMBODIMENTS

Before entering the description o the invention, a conventional construction of lead frame will now be described with reference to FIGS. 5 through 9.

As described hereinbefore, a number of dimples 3 are provided on the rear side of a bed portion 2 of a lead frame 1 in a lattice form. More specifically, the dimples 3 are formed at intersecting points of parallel lines disposed in X or widthwise direction of the bed portion 2 and parallel lines disposed in Y or longitudinal direction of the same portion as shown in FIG. 5 with an equal spacing t maintained therebetween. Each dimple 3 is formed into an inverted frustum of pyramid configuration, the sides of the square opening of the dimple 3 extending in parallel with the X-Y directions are of an equal measurement a as shown in FIG. 6(a), while the dimple 3 exhibits an opening angle $\theta$ and a depth d as shown in FIG. 6(b).

Figure 7:
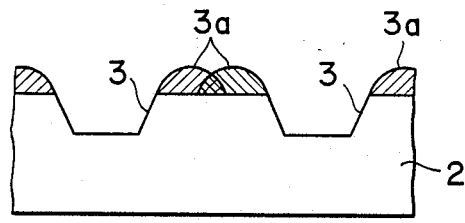
FIGS. 7, 8 and 9 are diagrams showing rising-up portions produced along outer sides of dimples and a bending deformation o the bed portion caused in the conventional construction, respectively.
Figure 8:
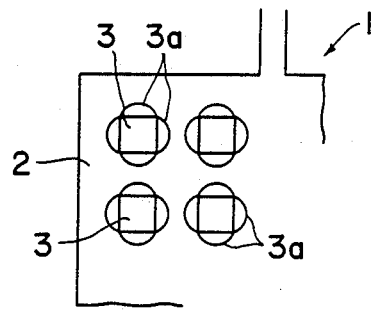
Figure 9:
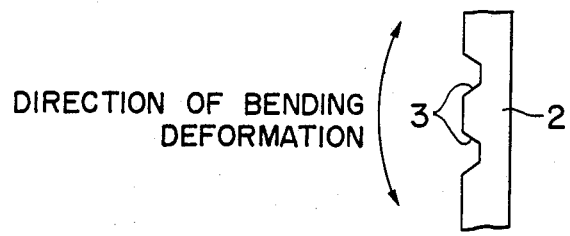

When the dimples 3 are formed on the rear side, the material thereby removed is shifted aside so that rising-up portions 3a are formed outwardly of the four sides as shown in FIGS. 7 and 8, and the rising-up portions 3a produced between two adjacent dimples 3 tend to interfere with each other, so that a bending deformation is caused to occur as shown in FIG. 8.

According to the present invention, the above described difficulty of the conventional lead frame is overcome by orienting the square formed dimples so as to form a predetermined angle of for instance 45° with respect to the X-Y directions of the bed portion, while these are arranged at intersecting points of parallel lines extending in parallel with the X-Y directions.

A preferred embodiment of the invention will now be described with reference to FIGS. 1 and 2.

In this embodiment, number of dimples 3 are formed on the rear side of the bed portion 2 of a lead frame 1, at intersecting points formed between a st of lines extending in parallel with the X (lateral) axis and another set of lines extending in parallel with the Y (longitudinal) axis of the bed portion 2 with an equal pitch t maintained between the adjacent intersecting points. In a case where the size of the bed portion 2 is of width W =4.4 mm and a length L =7.6 mm, each of the dimples 3 formed into an inverted frusto-pyramid configuration is made into the measurements of a side a=0.15 mm, a depth d =0.05 mm, and an opening angle $\theta$=60°.

The dimples 3 formed as described above are arranged such that the sides of each dimple are disposed at a
predetermined angle of, for instance, $\alpha$=45° relative to the X-Y axes of the bed portion. In this manner, the average interval between the opposing sides of adjacent dimples can be increased and the interference between rising-up portions formed by removed material can be reduced, and the bending deformation of the bed portion 2 can be reduced.

Figure 3:
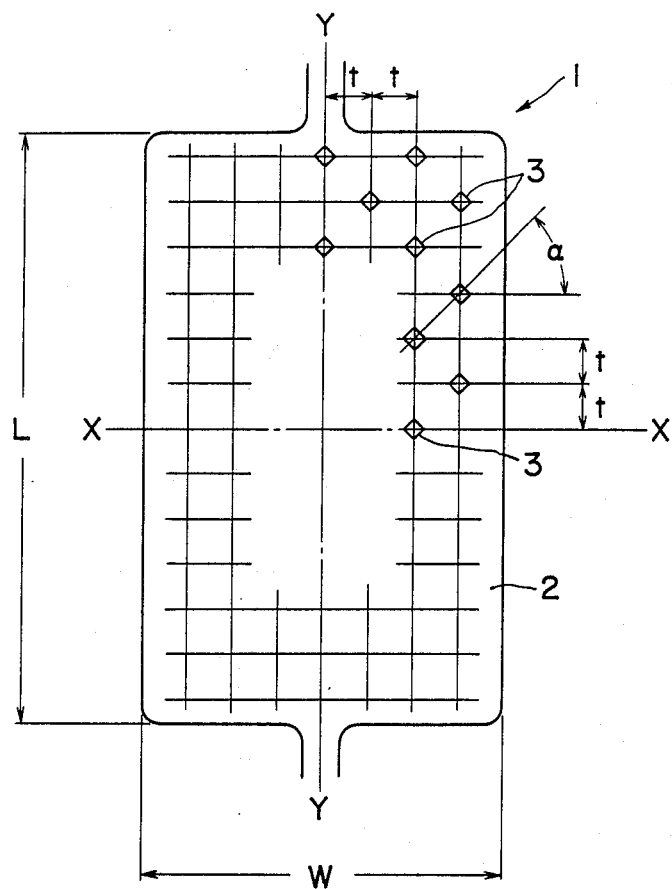
FIG. 3 is a plan view showing another embodiment of this invention.

FIG. 3 illustrates another embodiment of the invention wherein the dimples 3 formed in an inverted frusto-pyramid configuration are arranged at every other intersecting points formed between two sets of lines extending in parallel with X and Y axes of the bed portion 2 so that the dimples 3 are spaced apart in X and Y directions by an equal pitch of 2t. In this manner, the number of dimples is reduced from, for instance, 70 of the previous embodiment to 34 of this embodiment without accompanying any recognizable increase in deformation.

It should be noted that the dimple forming process is carried out just before the separation of the bed portion 2 from the ends of inner leads also provided in the lead frame.

Figure 4A:
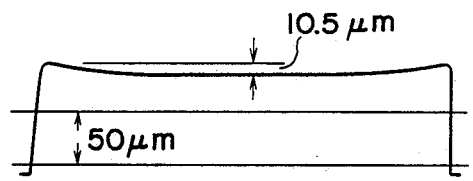
FIGS. 4(a) and 4(b) are diagrams showing bending deformations of the bed portion occurring in the invention and in a conventional construction.
Figure 4B:
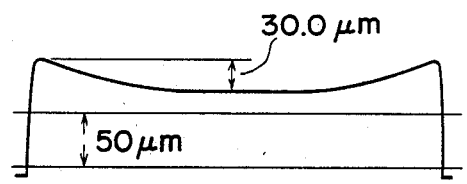

In the conventional construction where 70 dimples are formed as described above on the rear side of the bed portion of 4.4 ×7.6 mm size, at an equal pitch t =0.5 in X-Y directions, approximately 30 $\mu$ of bending deformation has been exhibited as shown in FIG. 4(b) along the length of 7.6 mm. In contrast, in the embodiment shown in FIG. 1, where the same number of dimples are arranged at the same pitch, with the dimples disposed at an angle of $a$=45° relative to the X-Y axes, the bending deformation is reduced to approximately 10.5 $\mu$ along the length of 7.6 mm as shown in FIG. 4(a).

Figure 1:
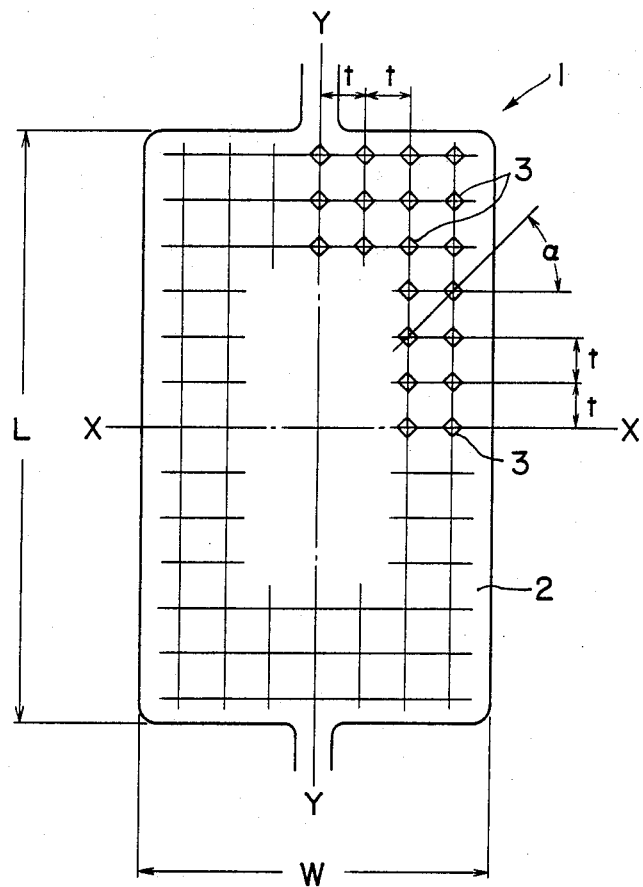
FIG. 1 is a plan view showing a bed portion of a lead frame constituting a preferred embodiment of the invention.
Figure 2A:
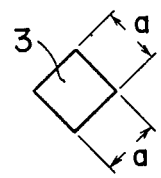
FIGS. 2(a) and 2(b) are enlarged views showing a dimple formed on the rearside of the bed portion of the shown embodiment.
Figure 2B:
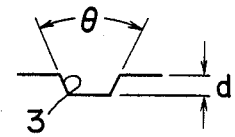

In the embodiment shown in FIG. 3, the reduction of the bending deformation is found to be substantially equal to that of the embodiment shown in FIG. 1.

The bending deformation may further be reduced by subjecting the bed portion to a depression process thereafter.

What is claimed is:

1. A lead frame having a number of square dimples arranged on the rear side of a bed portion in a lattice form, wherein each side of said square dimples is disposed obliquely so as to form a predetermined angle relative to either of X-Y axes of the lattice extending in widthwise and lengthwise directions of the bed portion.

2. The lead frame according to claim 1 wherein said predetermined angle is 45°.

3. The lead frame according to claim 1 wherein said square dimples are arranged in a lattice form at intersecting points of two sets of lines extending in parallel with the X and Y axes, with the pitch of the dimples made equal to a pitch t of the lattice.

4. The lead frame according to claim 1 wherein said square dimples are arranged in a lattice form, at every other intersecting points formed between two sets of lines extending in parallel with the X and Y axes, with the pitch of the dimples made equal to twice the pitch t of the lattice.

* * * * *